(12) United States Patent
Kim

(10) Patent No.: US 12,154,658 B2
(45) Date of Patent: Nov. 26, 2024

(54) DATA OUTPUT CONTROL CIRCUIT AND SEMICONDUCTOR DEVICE INCLUDING THE SAME

(71) Applicant: SK hynix Inc., Gyeonggi-do (KR)

(72) Inventor: Kwang Soon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 256 days.

(21) Appl. No.: 17/941,719

(22) Filed: Sep. 9, 2022

(65) Prior Publication Data

US 2023/0081690 A1 Mar. 16, 2023

(30) Foreign Application Priority Data

Sep. 10, 2021 (KR) ................... 10-2021-0121081

(51) Int. Cl.
  *G11C 7/22* (2006.01)
  *G11C 7/10* (2006.01)
  *G11C 8/04* (2006.01)
  *G11C 8/10* (2006.01)
  *H03K 19/20* (2006.01)

(52) U.S. Cl.
  CPC .............. *G11C 7/222* (2013.01); *G11C 7/106* (2013.01); *G11C 8/04* (2013.01); *G11C 8/10* (2013.01); *H03K 19/20* (2013.01)

(58) Field of Classification Search
  CPC ........... G11C 7/222; G11C 7/106; G11C 8/04; G11C 8/10; G11C 7/1063; G11C 7/1009; H03K 19/20; Y02D 10/00

USPC ..................................................... 365/189.15
See application file for complete search history.

(56) References Cited

U.S. PATENT DOCUMENTS

| 5,867,447 | A | * | 2/1999 | Koshikawa | ........... G11C 7/1072 |
|---|---|---|---|---|---|
| | | | | | 365/194 |
| 10,775,831 | B1 | * | 9/2020 | Kamiya | ................ G06F 1/3296 |
| 2005/0064829 | A1 | * | 3/2005 | Kang | .................... G06F 1/3287 |
| | | | | | 455/127.1 |
| 2019/0086949 | A1 | * | 3/2019 | Kamiya | ................... G06F 1/025 |
| 2021/0065755 | A1 | * | 3/2021 | Kim | ........................ G11C 8/18 |

FOREIGN PATENT DOCUMENTS

| KR | 10-1145784 B1 | 5/2012 |
|---|---|---|
| KR | 10-2017-0057628 A | 5/2017 |

* cited by examiner

*Primary Examiner* — Huan Hoang
(74) *Attorney, Agent, or Firm* — IP & T GROUP LLP

(57) ABSTRACT

A semiconductor device includes: a memory cell array including a plurality of memory cells; a data input/output circuit suitable for outputting data provided from the memory cell array in response to a couple of data output control signals; and a data output control circuit suitable for generating a couple of latch read enable signals and a couple of data output control timing signals based on a couple of complementary read enable signals, an internal enable signal and warming-up cycle information indicating different warming-up cycles, and outputting, according to the couple of data output control timing signals, the couple of data output control signals using the couple of latch read enable signals, one or more pulses of each of which are masked according to the warming-up cycle information.

21 Claims, 12 Drawing Sheets

DATA OUTPUT CONTROL CIRCUIT AND SEMICONDUCTOR DEVICE INCLUDING THE SAME

CROSS-REFERENCE TO RELATED APPLICATION

This application claims priority under 35 U.S.C. § 119 to Korean Patent Application No. 10-2021-0121081, filed on Sep. 10, 2021, which is incorporated herein by reference in its entirety.

BACKGROUND

1. Field

Various embodiments of the present disclosure generally relate to a semiconductor circuit, and, more particularly, to a data output control circuit and a semiconductor device including the same.

2. Discussion of the Related Art

Recently, the paradigm for the computer environment has changed to ubiquitous computing in which computer systems can be used anytime and anywhere. Due to this fact, the use of portable electronic devices such as mobile phones, digital cameras, and notebook computers has rapidly increased. In general, such portable electronic devices use a memory system which uses a semiconductor memory device, that is, a data storage device. The data storage device is used as a main memory device or an auxiliary memory device of the portable electronic devices.

For example, a semiconductor memory device may store externally provided data into a memory region and may output data from the memory region to an external of the semiconductor memory device. In order to improve the high-speed operation and operation reliability of the semiconductor memory device, it is very important to control data input/output timings.

SUMMARY

Various embodiments of the present disclosure are directed to a data output control circuit and a semiconductor device including the same for improving a data output timing control performance.

In an embodiment of the present disclosure, a data output control may include a decoder suitable for generating warming-up cycle information indicating different warming-up cycles by decoding warming-up cycle preliminary information for setting one of the warming-up cycles; a first data output control circuit suitable for generating a first latch read enable signal and a first data output control timing signal based on a first read enable signal, an internal enable signal and the warming-up cycle information, and generating, in response to the first data output control timing signal, a first data output control signal using the first latch read enable signal, one or more pulses of which are masked according to the warming-up cycle information; and a second data output control circuit suitable for generating a second latch read enable signal and a second data output control timing signal based on a second read enable signal, which is complementary to the first read enable signal, the internal enable signal and the warming-up cycle information, and generating, in response to the second data output control timing signal, a second data output control signal using the second latch read enable signal, of which one or more pulses are masked according to the warming-up cycle information.

In an embodiment of the present disclosure, a semiconductor device may include a memory cell array including a plurality of memory cells; a data input/output circuit suitable for outputting data provided from the memory cell array in response to a couple of data output control signals; and a data output control circuit suitable for generating a couple of latch read enable signals and a couple of data output control timing signals based on a couple of complementary read enable signals, an internal enable signal and warming-up cycle information indicating different warming-up cycles, and outputting, according to the couple of data output control timing signals, the couple of data output control signals using the couple of latch read enable signals, one or more pulses of each of which are masked according to the warming-up cycles.

In an embodiment of the present disclosure, a semiconductor device may include first and second circuits each configured to: enable a timing signal according to an edge of a corresponding one of first and second input clocks, the edge corresponding to an enabled one of information signals representing respective warming-up cycles, the first and second input clocks being complementary to each other, generate an internal clock by masking one or more cycles of the input clock according to the enabled timing signal, and generate a corresponding one of first and second output clocks according to an edge of the internal clock, the first and second output clocks having a half frequency of the input clocks and having different phases from each other.

DETAILED DESCRIPTION

Figure 1:
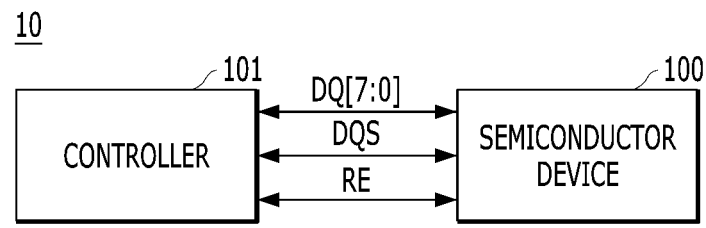
FIG. 1 is a diagram illustrating a configuration of a semiconductor system in accordance with an embodiment of the present disclosure.

Various embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout this disclosure, like reference numerals refer to like parts throughout the various figures and embodiments of the present disclosure.

FIG. 1 is a diagram illustrating a configuration of a semiconductor system 10 in accordance with an embodiment of the present disclosure.

Referring to FIG. 1, the semiconductor system 10 may include a semiconductor device 100 and a controller 101. The semiconductor device 100 may operate based on the control of the controller 101. In response to a write command that is provided from the controller 101, the semiconductor device 100 may write data into a memory cell array 110. When receiving a write command, an address and data from the controller 101, the semiconductor device 100 may write the data into memory cells that correspond to the address.

In response to a read command that is provided from the controller 101, the semiconductor device 100 may perform a read operation. When receiving a read command and an address from the controller 101, the semiconductor device 100 may read data from memory cells that correspond to the address to output the read data to the controller 101.

The semiconductor device 100 may include at least one of a NAND flash memory, a vertical NAND (hereinafter, referred to as a 'VNAND'), a NOR flash memory, a resistive random access memory (RRAM), a phase-change memory (PRAM), a magneto-resistive random access memory (MRAM), a ferroelectric random access memory (FRAM), and a spin transfer torque random access memory (SU-RAM). In an embodiment, the semiconductor device 100 may be implemented to have a three-dimensional array structure. In an embodiment, the semiconductor device 100 may be applied to a flash memory device with a charge storage layer comprising a conductive floating gate as well as a charge trap flash (CTF) with a charge storage layer comprising an insulating layer.

The controller 101 may be coupled between the semiconductor device 100 and a host. The host may include a central processing unit (CPU), a graphic processing unit (GPU), and so forth. The controller 101 may be configured to interface the host and the semiconductor device 100. Based on the control of the host, the controller 101 may provide the semiconductor device 100 with a write command and a read command.

Coupled between the controller 101 and the semiconductor device 100 may be signal lines configured to transfer data DQ[7:0], a signal line configured to transfer a data strobe signal DQS, and a signal line configured to transfer a read enable signal RE. The read enable signal RE may be provided from the controller 101. The read enable signal RE may include signals of a complementary form and may be referred to as an external clock signal. FIG. 1 illustrates the data DQ[7:0] with 8 bits, however, the data may comprise 16 bits, 32 bits, and so forth.

The data strobe signal DQS may be a bi-directional signal. During a data output operation of the semiconductor device 100, the data strobe signal DQS may be provided from the semiconductor device 100 to the controller 101. While data is input to the semiconductor device 100, the data strobe signal DQS may be provided from the controller 101 to the semiconductor device 100.

After the read enable signal RE is provided to the semiconductor device 100, the data DQ[7:0] may be output based on the data strobe signal DQS. When data is transferred between the controller 101 and the semiconductor device 100, a data transmission timing may be adjusted by a warming-up cycle that is defined in an operational specification of the semiconductor device 100. According to the operational specification of the semiconductor device 100, data should be output after the warming-up cycle elapses with reference to the read enable signal RE.

The warming-up cycle may be set as one of '0', '1', '2', and '4'. When the warming-up cycle is set as '0', data may be output in a first cycle of the read enable signal RE without performing warming-up. When the warming-up cycle is set as '1', data that is output may be delayed in the first cycle of the read enable signal RE and data may be output in a second cycle of the read enable signal RE. When the warming-up cycle is set as '2', data that is output may be delayed in the first and second cycles of the read enable signal RE and data may be output in a third cycle of the read enable signal RE. When the warming-up cycle is set as '4', data that is output may be delayed in the first to fourth cycles of the read enable signal RE and data may be output in a fifth cycle of the read enable signal RE.

Figure 2:
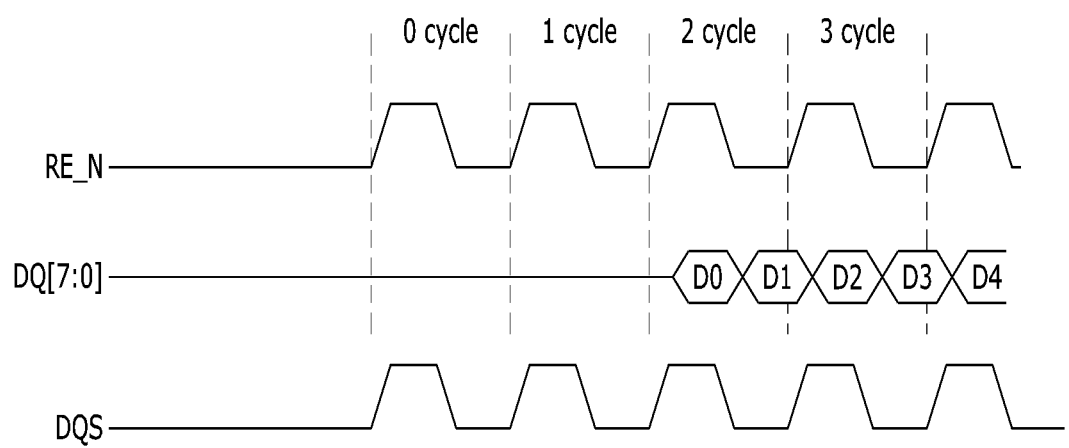
FIG. 2 is a diagram illustrating a data output timing according to a warming-up cycle of a semiconductor device in accordance with an embodiment of the present disclosure.

FIG. 2 is a diagram illustrating a data output timing according to a warming-up cycle of a semiconductor device in accordance with an embodiment of the present disclosure. FIG. 2 illustrates a read enable signal RE_N, the data DQ[7:0] and the data strobe signal DQS. The read enable signal RE_N may include signals of a complementary form as described above, and FIG. 2 illustrates the read enable signal RE_N as one of the signals of the complementary form.

When the warming-up cycle is set as '2', as illustrated in FIG. 2, data that is output may be delayed in the first and second cycles ("0 cycle" and "1 cycle") of the read enable signal RE_N and the data DQ[7:0] may be output based on the data strobe signal DQS in a third cycle ("2 cycle") of the read enable signal RE_N.

According to an embodiment of the present disclosure, the semiconductor device 100 may internally adjust the timings of the read enable signal RE_N to output data based on the warming-up cycle.

Figure 3:
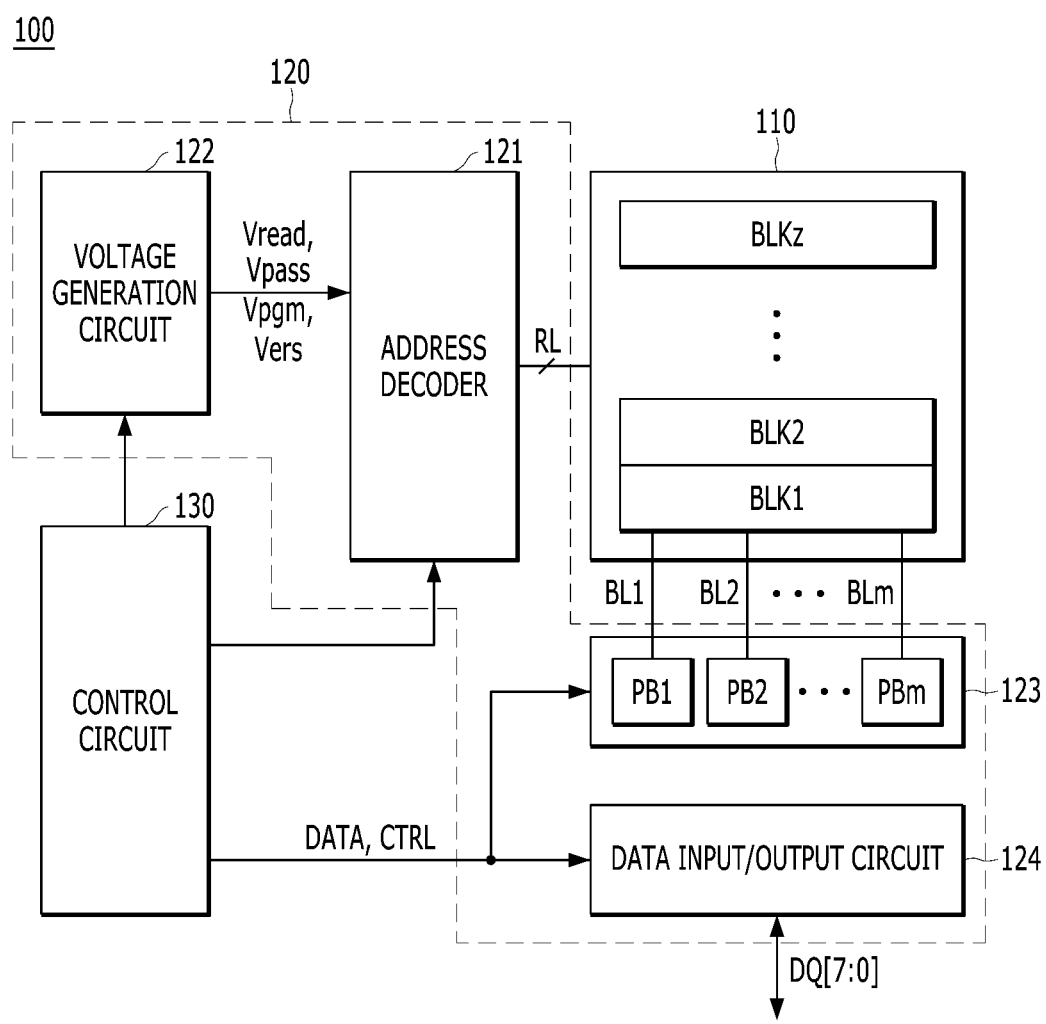
FIG. 3 is a diagram illustrating a configuration of a semiconductor device in accordance with an embodiment of the present disclosure.

FIG. 3 is a diagram illustrating a configuration of the semiconductor device 100 in accordance with an embodiment of the present disclosure.

Referring to FIG. 3, the semiconductor device 100 may include the memory cell array 110, a peripheral circuit 120 and a control circuit 130. The peripheral circuit 120 may include an address decoder 121, a voltage generation circuit 122, a read/write circuit 123 and a data input/output circuit 124.

The memory cell array 110 may be coupled to the address decoder 121 through row lines RL and may be coupled to the read/write circuit 123 through bit lines BL1 to BLm. The memory cell array 110 may include a plurality of memory blocks BLK1 to BLKz. The plurality of memory blocks BLK1 to BLKz may be coupled to the address decoder 121 through row lines RL. The plurality of memory blocks BLK1 to BLKz may be coupled to the read/write circuit 123 through the bit lines BL1 to BLm. Each of the plurality of memory blocks BLK1 to BLKz may include a plurality of memory cells. The plurality of memory cells may be non-volatile memory cells. Each of the plurality of memory blocks BLK1 to BLKz may include a plurality of pages. Among the plurality of memory cells, memory cells that are coupled to a single row line may be defined as a single page.

The memory cells may be configured by one or more of a single level cell (SLC) that is capable of storing therein a single data bit, a multi-level cell (MLC) that is capable of storing therein two data bits, a triple level cell (TLC) that is capable of storing therein three data bits and a quadruple level cell (QLC) that is capable of storing therein four data bits.

The peripheral circuit 120 may drive the memory cell array 110 to perform a program operation, a read operation, and an erase operation.

The address decoder 121 may be coupled to the memory cell array 110 through the row lines RL. The address decoder 121 may be configured to operate based on the control of the control circuit 130. The address decoder 121 may receive an address ADDR from the control circuit 130.

The address decoder 121 may decode a block address within the address ADDR. The address decoder 121 may select at least one of the plurality of memory blocks BLK1 to BLKz based on the decoded block address. The address decoder 121 may decode a row address within the address ADDR. According to the decoded row address, the address decoder 121 may select at least one of the row lines RL that are coupled to the selected memory block by applying voltages, which are provided from the voltage generation circuit 122, to the at least one row line RL.

The address decoder 121 may perform a program operation by applying a program voltage Vpgm to the selected row line and applying a pass voltage Vpass, which is lower than the program voltage Vpgm, to non-selected row lines.

The address decoder 121 may perform a read operation by applying a read voltage Vread to the selected row line and applying a pass voltage Vpass, which is higher than the read voltage Vread, to the non-selected row lines.

An erase operation may be performed in units of memory blocks within the semiconductor device 100. The address decoder 121 may decode a block address and may select a single memory block based on the decoded block address. The address decoder 121 may perform an erase operation by applying a ground voltage to the row lines RL that are coupled to the selected memory block and applying an erase voltage Vers to a bulk region in which the selected memory block is formed.

The voltage generation circuit 122 may generate various voltages that are required for the semiconductor device 100 to operate. The voltage generation circuit 122 may generate and provide the read voltage Vread, the pass voltage Vpass, the program voltage Vpgm, the erase voltage Vers, and so forth to the address decoder 121. In an embodiment, the voltage generation circuit 122 may include a plurality of pumping capacitors and may selectively activate, based on the control of the control circuit 130, the plurality of pumping capacitors to generate the plurality of voltages.

The read/write circuit 123 may include a plurality of page buffers, e.g., first to m-th page buffers PB1 to PBm. The first to m-th page buffers PB1 to PBm may be coupled to the memory cell array 110, respectively, through the first to m-th bit lines BL1 to BLm. The first to m-th page buffers PB1 to PBm may operate in response to control signals CTRL that are provided from the control circuit 130.

The first to m-th page buffers PB1 to PBm may perform data communication with the data input/output circuit 124. The first to m-th page buffers PB1 to PBm may perform a program operation by transferring to-be-stored data from the data input/output circuit 124 and data lines DL to the memory cell array 110. The read/write circuit 123 may perform a read operation by reading data from memory cells of a selected page through the bit lines BL1 to BLm and by providing the read data to the data input/output circuit 124. The read/write circuit 123 may perform an erase operation by floating the bit lines BL1 to BLm.

The data input/output circuit 124 may be coupled to the first to m-th page buffers PB1 to PBm through the data lines DL. In response to the control signals CTRL that are provided from the control circuit 130, the data input/output circuit 124 may perform data input/output operations. During a read operation, the data input/output circuit 124 may output data, which is provided from the first to m-th page buffers PB1 to PBm, to the controller 101 at timings based on the above-described warming-up cycle.

The control circuit 130 may be coupled to the address decoder 121, the voltage generation circuit 122, the read/write circuit 123, and the data input/output circuit 124. The control circuit 130 may be configured to control overall operations of the semiconductor device 100. The control circuit 130 may operate in response to a command CMD provided from an external device. During a read operation, the control circuit 130 may generate a data output control signal by internally adjusting timings of the read enable signal RE_N and may output the generated data output control signal as one of the control signals CTRL such that data is output based on the warming-up cycle.

The control circuit 130 may output, as the data output control signal, a signal with timings, at which pulses, among pulses of the read enable signal RE_N, corresponding to the warming-up cycles are masked.

Figure 4:
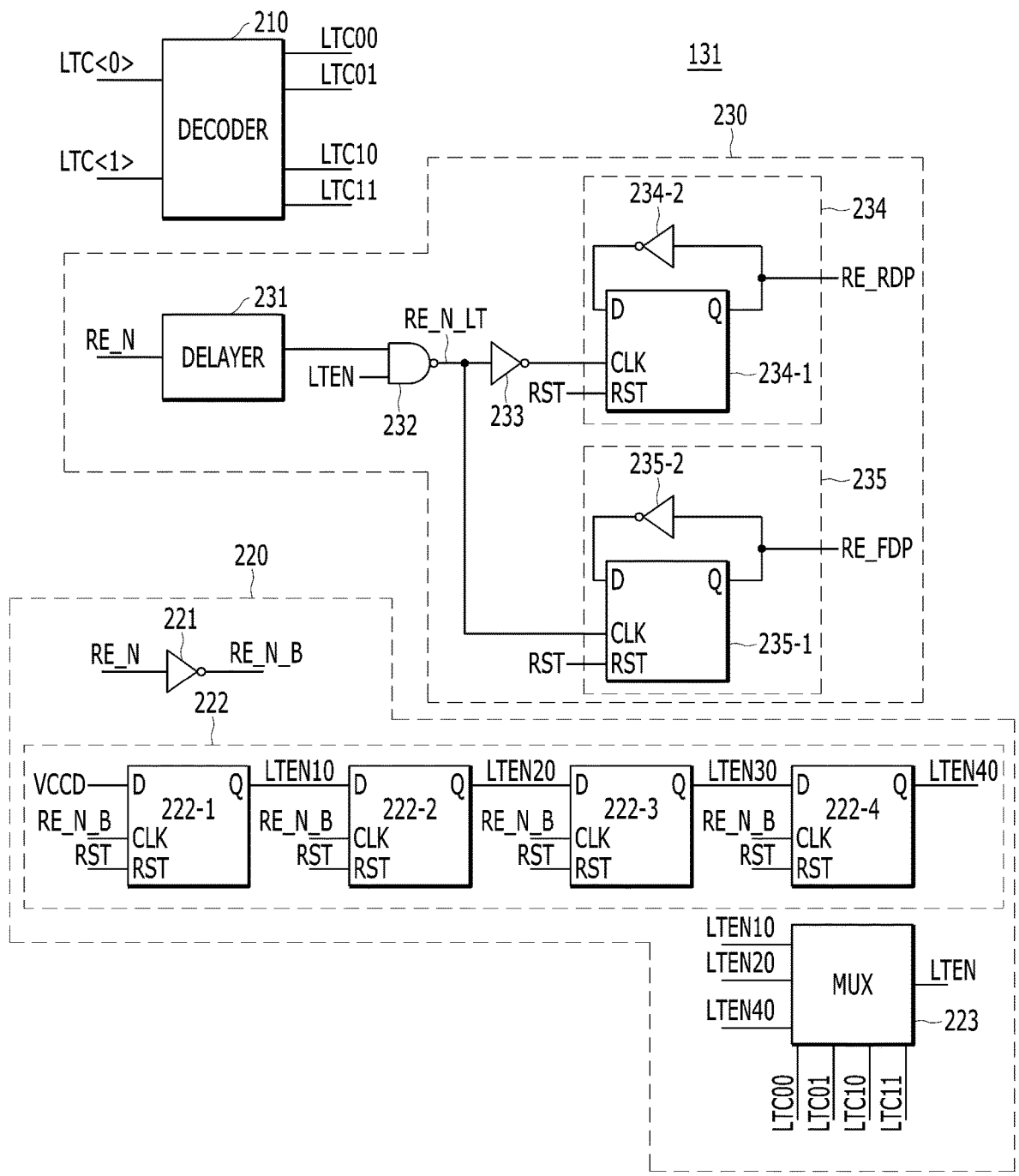
FIG. 4 is a diagram illustrating a configuration of a data output control circuit in accordance with an embodiment of the present disclosure.
Figure 5:
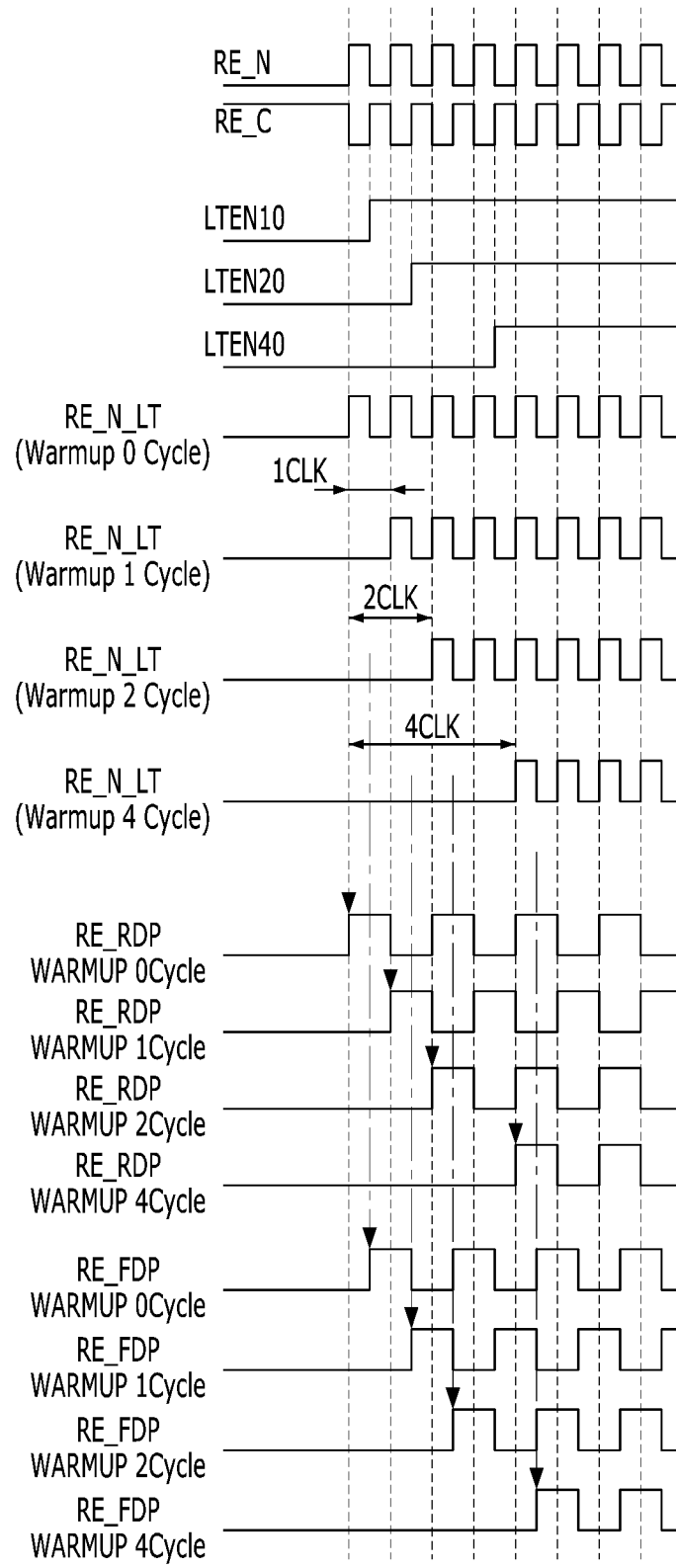
FIG. 5 is an operation timing diagram of the data output control circuit in accordance with an embodiment of the present disclosure.

FIG. 4 is a diagram illustrating a configuration of a data output control circuit 131 in accordance with an embodiment of the present disclosure. FIG. 5 is an operation timing diagram of the data output control circuit 131 in accordance with an embodiment of the present disclosure.

Hereinafter, with reference to FIGS. 4 and 5, the configuration and operation of the data output control circuit 131 in accordance with an embodiment of the present disclosure will be described.

According to an embodiment of the present disclosure, the data output control circuit 131 may be included in the control circuit 130 of FIG. 3, which is just an example. The arrangement of the data output control circuit 131 will not be limited thereto.

According to an embodiment of the present disclosure, the data output control circuit 131 may include a decoder 210, a timing signal generating circuit 220, and a control signal generating circuit 230 as illustrated in FIG. 4.

The decoder 210 may decode warming-up cycle preliminary information LTC<0:1>, which is for setting the warming-up cycle, to generate warming-up cycle information LTC00, LTC01, LTC10, and LTC11. The warming-up cycle information LTC00 may correspond to a warming-up cycle '0', the warming-up cycle information LTC01 may correspond to a warming-up cycle '1', the warming-up cycle information LTC10 may correspond to a warming-up cycle '2', and the warming-up cycle information LTC11 may correspond to a warming-up cycle '4'. For example, the warming-up cycle of the semiconductor device 100 may be set as '0' when only the warming-up cycle information LTC00, among the warming-up cycle information LTC00, LTC01, LTC10, and LTC11, has a high level. The warming-up cycle may be set as '1' when only the warming-up cycle information LTC01, among the warming-up cycle information LTC00, LTC01, LTC10, and LTC11, has a high level. The warming-up cycle may be set as '2' when only the warming-up cycle information LTC10, among the warming-up cycle information LTC00, LTC01, LTC10, and LTC11, has a high level. The warming-up cycle may be set as '4' when only the warming-up cycle information LTC11, among the warming-up cycle information LTC00, LTC01, LTC10, and LTC11, has a high level.

The timing signal generating circuit 220 may generate preliminary timing signals LTEN10, LTEN20, LTEN30, and LTEN40 based on the read enable signal RE_N and may output, as a timing signal LTEN, one of the preliminary timing signals LTEN10, LTEN20 and LTEN40 based on the warming-up cycle information LTC00, LTC01, LTC10, and LTC11. The timing signal generating circuit 220 may include a logic gate 221, a shift register 222, and a multiplexer (MUX) 223.

The logic gate 221 may invert the read enable signal RE_N to generate an inverted read enable signal RE_N_B.

The shift register 222 may shift a power voltage VCCD based on the inverted read enable signal RE_N_B to generate the preliminary timing signals LTEN10, LTEN20, LTEN30, and LTEN40. The shift register 222 may include a plurality of flip-flops, e.g., first to fourth flip-flops 222-1 to 222-4. The first to fourth flip-flops 222-1 to 222-4 may commonly receive the inverted read enable signal RE_N_B as a reference signal for a shifting operation (i.e., a clock signal). The first flip-flop 222-1 may latch the level of the power voltage VCCD in response to the transition of the inverted read enable signal RE_N_B and may output the latched signal as the preliminary timing signal LTEN10. The second flip-flop 222-2 may latch the preliminary timing signal LTEN10 in response to the transition of the inverted read enable signal RE_N_B and may output the latched signal as the preliminary timing signal LTEN20. The third flip-flop 222-3 may latch the preliminary timing signal LTEN20 in response to the transition of the inverted read enable signal RE_N_B and may output the latched signal as the preliminary timing signal LTEN30. The fourth flip-flop 222-4 may latch the preliminary timing signal LTEN30 in response to the transition of the inverted read enable signal RE_N_B and may output the latched signal as the preliminary timing signal LTEN40.

Referring to FIG. 5, a pair of the read enable signals RE_N and RE_C may be input. The read enable signals RE_N and RE_C may have respective phases opposite to each other. The inverted read enable signal RE_N_B may have the same phase as the read enable signal RE_C.

With reference to rising edges of the inverted read enable signal RE_N_B, the preliminary timing signals LTEN10, LTEN20, LTEN30, and LTEN40 may sequentially transition to a high level.

According to the warming-up cycle information LTC00, LTC01, LTC10, and LTC11, the multiplexer 223 may output, as the timing signal LTEN, one of the preliminary timing signals LTEN10, LTEN20, and LTEN40. Here, the data output control circuit 131 of FIG. 4 is illustrated not to input the preliminary timing signal LTEN30 to the multiplexer 223 since the semiconductor device 100 is sufficient to support the warming-up cycles '0', '1', '2', and '4' that are defined in the operational specification as described earlier. The multiplexer 223 may output the preliminary timing signal LTEN10 as the timing signal LTEN when the warming-up cycle information LTC01, among the warming-up cycle information LTC00, LTC01, LTC10, and LTC11, has a high level. The multiplexer 223 may output the preliminary timing signal LTEN20 as the timing signal LTEN when the warming-up cycle information LTC10, among the warming-up cycle information LTC00, LTC01, LTC10, and LTC11, has a high level. The multiplexer 223 may output the preliminary timing signal LTEN40 as the timing signal LTEN when the warming-up cycle information LTC11, among the warming-up cycle information LTC00, LTC01, LTC10, and LTC11, has a high level. When the warming-up cycle information LTC00, among the warming-up cycle information LTC00, LTC01, LTC10, and LTC11, has a high level (i.e., when the warming-up cycle is not applied), the multiplexer 223 may output the timing signal LTEN to a high level at a timing prior to a timing when the preliminary timing signal LTEN10 transitions to a high level.

The control signal generating circuit 230 may generate data output control signals RE_RDP and RE_FDP by utilizing a signal, which masks pulses, among pulses of the read enable signal RE_N, corresponding to the warming-up cycle, based on the timing signal LTEN. Between the data output control signals RE_RDP and RE_FDP, the data output control signal RE_RDP may be referred to as a first data output control signal RE_RDP, and the data output control signal RE_FDP may be referred to as a second data output control signal RE_FDP.

The control signal generating circuit 230 may include a delayer 231, logic gates 232 and 233, and oscillators 234 and 235.

The delayer 231 may delay the read enable signal RE_N by a predetermined amount of time to drive the read enable signal RE_N after the predetermined amount of time. The delayer 231 may be configured to compensate for delay of signal processing of the timing signal generating circuit 220. That is, the delayer 231 may be designed to have a delay amount that corresponds to the delay of signal processing of the timing signal generating circuit 220.

The first logic gate 232 may perform a NAND operation on an output signal of the delayer 231 and the timing signal LTEN to output a signal RE_N_LT. The second logic gate 233 may invert the signal RE_N_LT that is output from the first logic gate 232.

Referring to FIG. 5, the signal RE_N_LT that is output from the first logic gate 232 may have the same waveform as the read enable signal RE_N when the warming-up cycle is set as '0'. The signal RE_N_LT may have a waveform, which masks a first cycle of the read enable signal RE_N, when the warming-up cycle is set as '1'. The signal RE_N_LT may have a waveform, which masks the first and second cycles of the read enable signal RE_N, when the warming-up cycle is set as '2'. The signal RE_N_LT may have a waveform, which masks the first to fourth cycles of the read enable signal RE_N, when the warming-up cycle is set as '4'.

The first oscillator 234 may perform an oscillation operation in response to an output signal of the second logic gate 233 to generate the first data output control signal RE_RDP of the data output control signals RE_RDP and RE_FDP. The first oscillator 234 may include a flip-flop 234-1 and a logic gate 234-2. The flip-flop 234-1 may generate the first data output control signal RE_RDP by repeating an operation of receiving, as a clock signal, the output signal of the second logic gate 233 and of receiving, as a feed-back signal from the logic gate 234-2, an inverted signal of an output terminal level in response to the transition of the output signal of the second logic gate 233, the logic gate 234-2 inverting the output terminal level to generate the inverted signal.

Referring to FIG. 5, the first data output control signal RE_RDP may start the transition thereof with reference to rising edges of the signal RE_N_LT based on the respective warming-up cycles '0', '1', '2', and '4' and may have a half frequency of the signal RE_N_LT.

The second oscillator 235 may perform an oscillation operation in response to an output signal of the first logic gate 232 to generate the second data output control signal RE_FDP of the data output control signals RE_RDP and RE_FDP. The second oscillator 235 may include a flip-flop 235-1 and a logic gate 235-2. The flip-flop 235-1 may generate the second data output control signal RE_FDP by repeating an operation of receiving, as a clock signal, the output signal of the first logic gate 232 and of receiving, as a feed-back signal from the logic gate 235-2, an inverted signal of an output terminal level in response to the transition of the output signal of the first logic gate 232, the logic gate 235-2 inverting the output terminal level to generate the inverted signal.

Referring to FIG. 5, the second data output control signal RE_FDP may start the transition thereof with reference to falling edges of the signal RE_N_LT based on the respective warming-up cycles '0', '1', '2', and '4' and may have a half frequency of the signal RE_N_LT.

As described above, the data output control circuit 131, according to an embodiment, may generate the data output control signals RE_RDP and RE_FDP based on the signal, which masks the pulses of the read enable signal RE_N to support the warming-up cycle.

Therefore, when the warming-up cycle is set as '0' (i.e., when the warming-up cycle is not applied), the semiconductor device 100 may output data based on the data output control signals RE_RDP and RE_FDP from the first cycle of the read enable signal RE_N.

When the warming-up cycle is set as '1', the semiconductor device 100 may output data based on the data output control signals RE_RDP and RE_FDP from the second cycle of the read enable signal REN.

When the warming-up cycle is set as '2', the semiconductor device 100 may output data based on the data output control signals RE_RDP and RE_FDP from the third cycle of the read enable signal RE_N.

When the warming-up cycle is set as '4', the semiconductor device 100 may output data based on the data output control signals RE_RDP and RE_FDP from the fifth cycle of the read enable signal RE_N.

Hereinafter, with reference to FIGS. 6 and 12B, the configuration and operation of a data output control circuit 132 will be described in accordance with another embodiment of the present disclosure.

According to another embodiment of the present disclosure, the data output control circuit 132 may be included in the control circuit 130 of FIG. 3, which is just an example. The arrangement of the data output control circuit 132 will not be limited thereto. According to another embodiment of the present disclosure, the data output control circuit 132 may output, as the data output control signal, a signal with timings, at which pulses, among pulses of the read enable signal RE_N, corresponding to the warming-up cycles, are masked based on multiple phase clock signals RE_N and RE_C. Therefore, under the low voltage condition (i.e., a condition that an operational voltage is low) and the high-speed operation condition (i.e., a condition that an operational frequency is high), the data output control circuit 132 may stably operate by securing a timing margin twice as great than the data output control circuit 131 configured to perform the masking operation based on the read enable signal RE_N as described with reference to FIG. 4.

Figure 6:
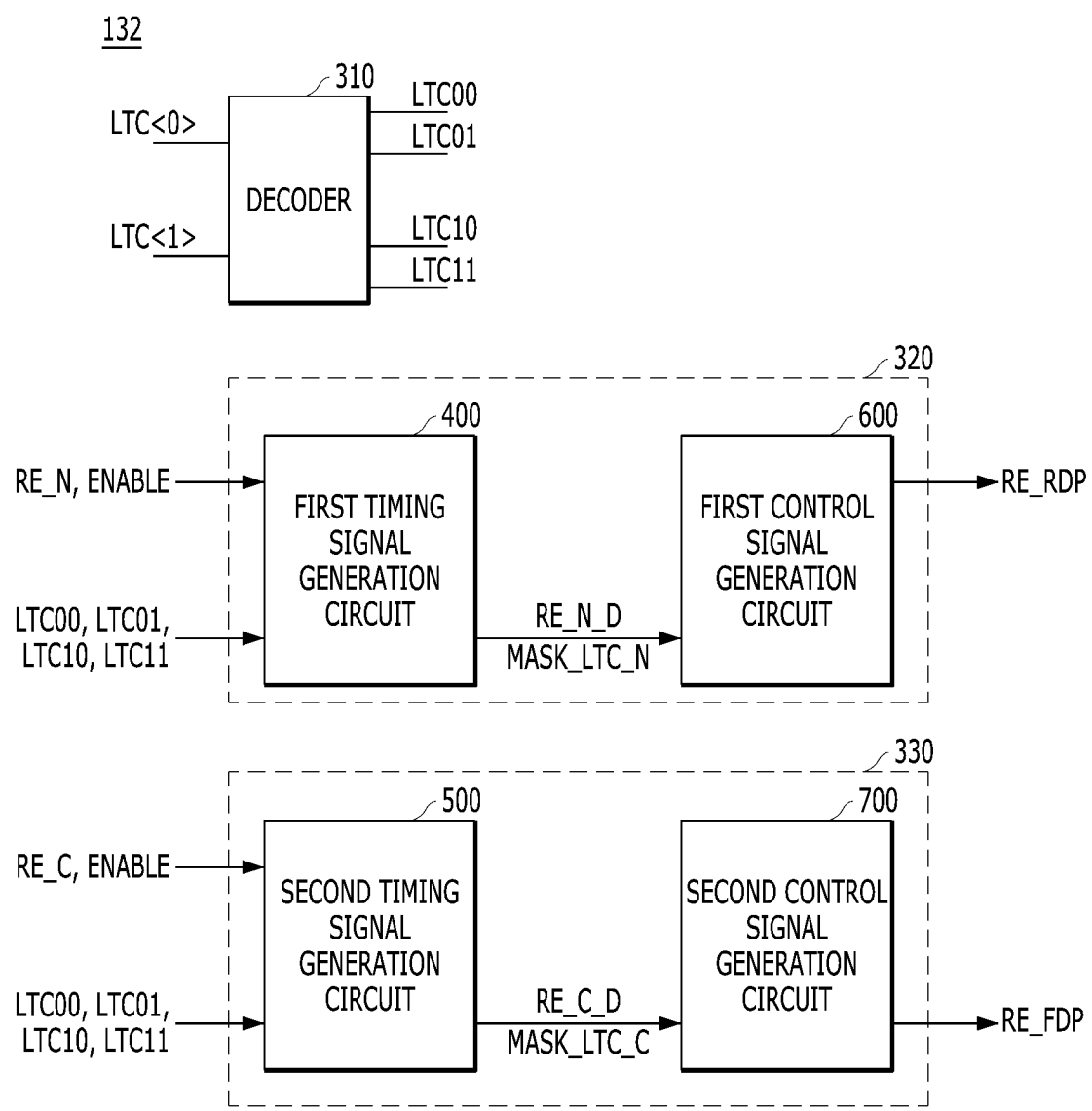
FIG. 6 is a diagram illustrating a configuration of a data output control circuit in accordance with another embodiment of the present disclosure.
Figure 7:
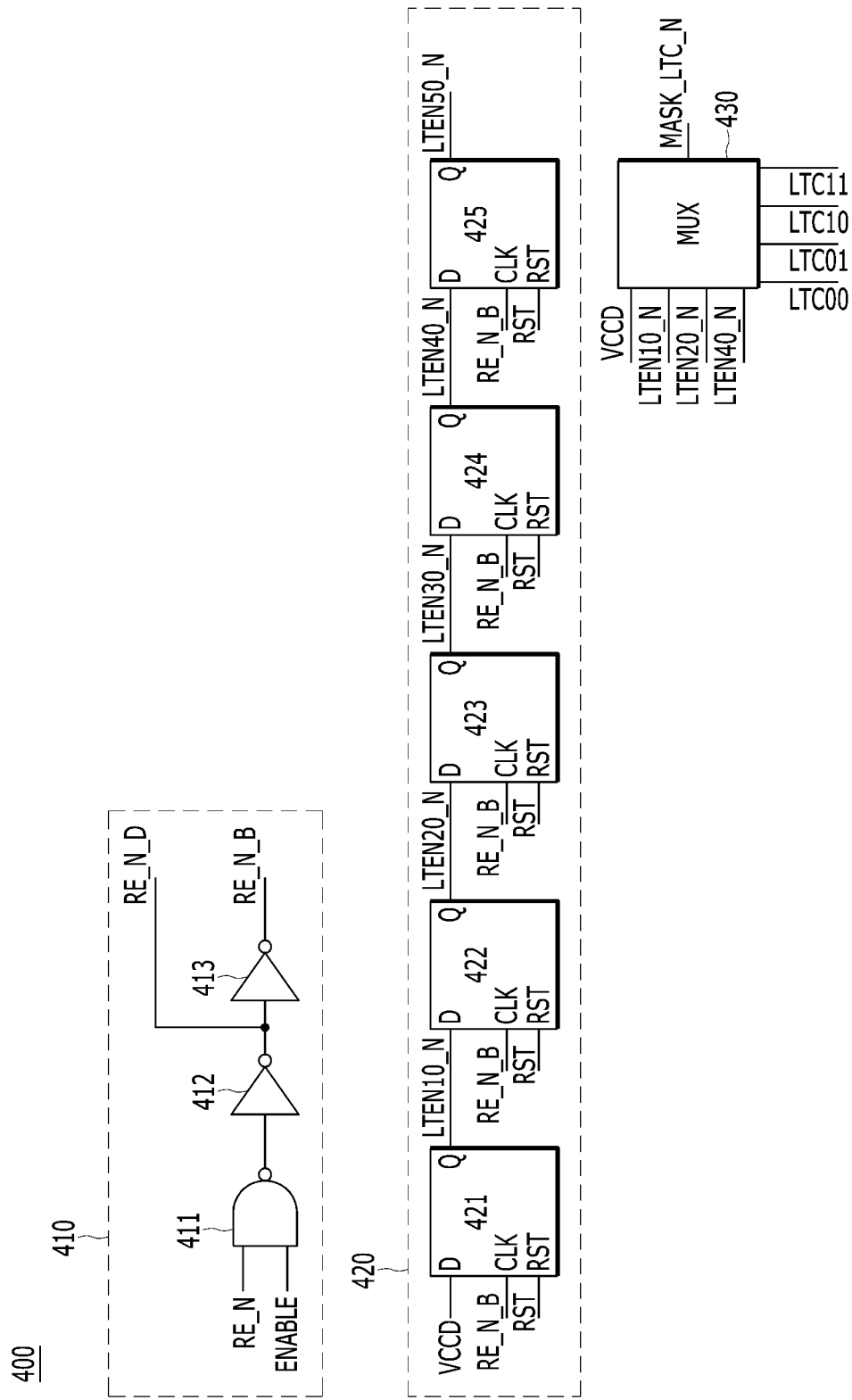
FIG. 7 is a diagram illustrating a configuration of a first timing signal generating circuit illustrated in FIG. 6 in accordance with an embodiment of the present disclosure.
Figure 8:
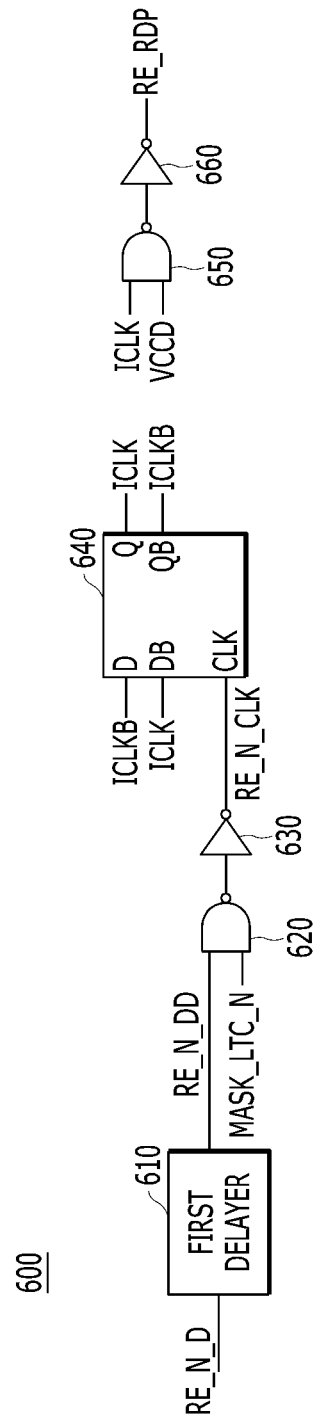
FIG. 8 is a diagram illustrating a configuration of a first control signal generating circuit illustrated in FIG. 6 in accordance with an embodiment of the present disclosure.
Figure 9:
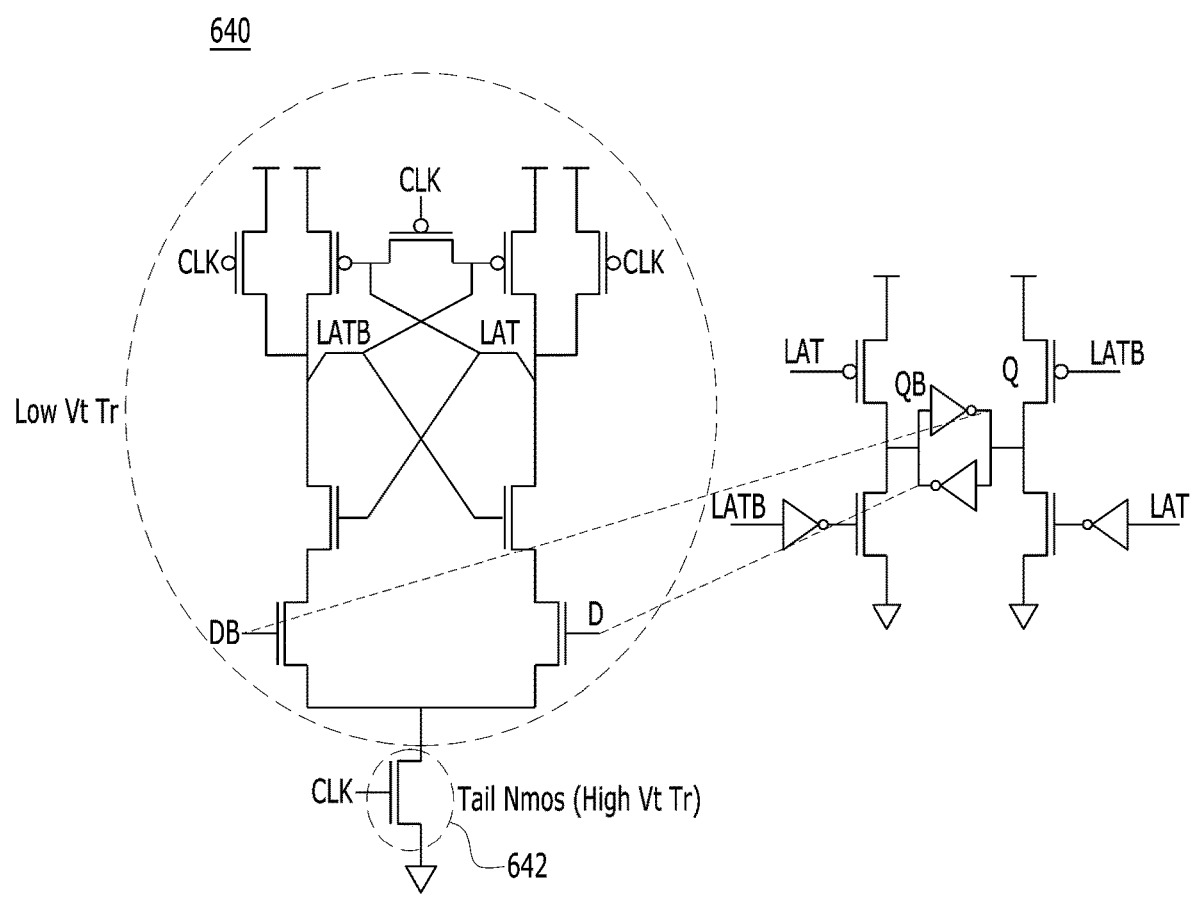
FIG. 9 is a diagram illustrating a configuration of an eleventh flipflop illustrated in FIG. 8 in accordance with an embodiment of the present disclosure.
Figure 10:
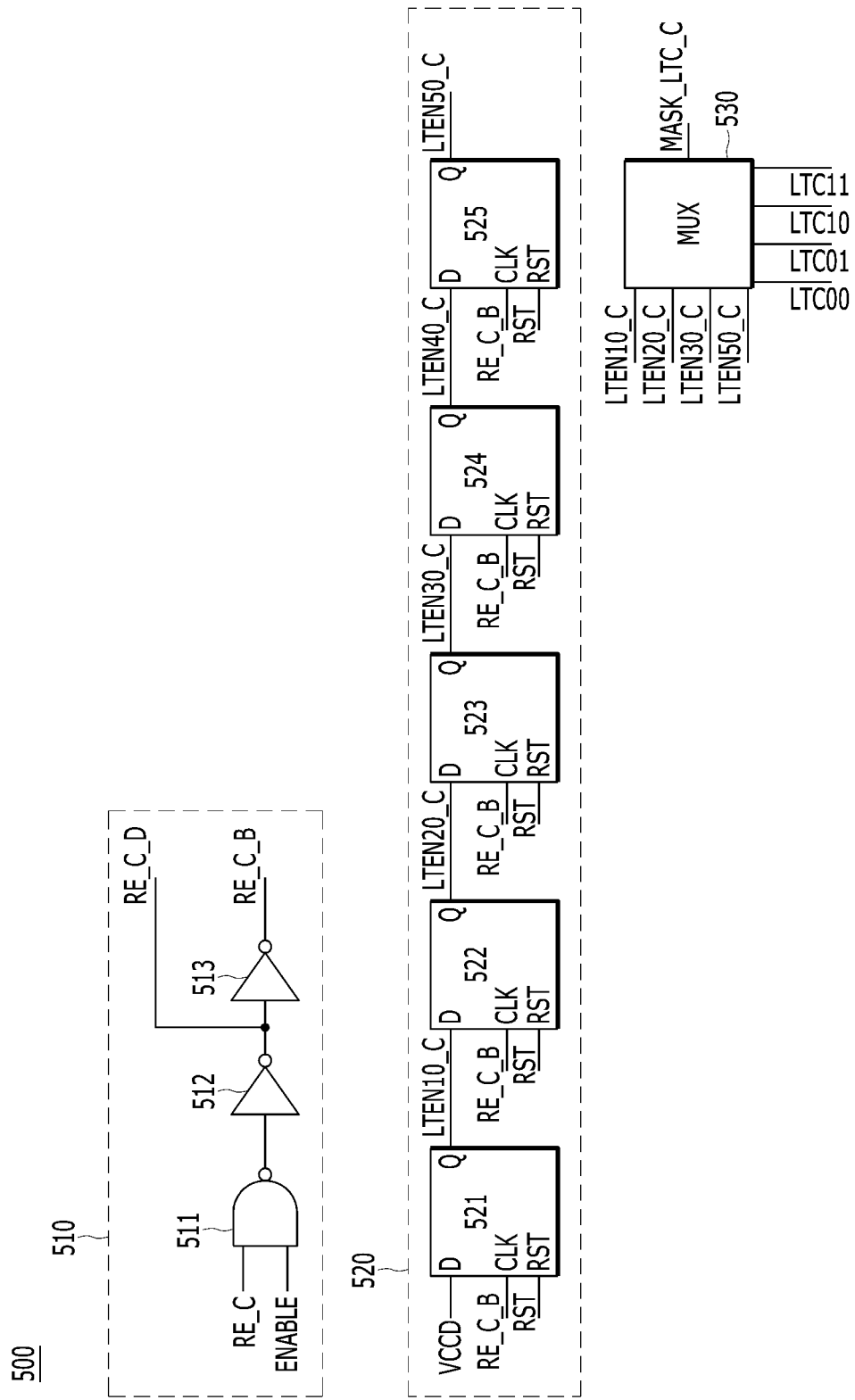
FIG. 10 is a diagram illustrating a configuration of a second timing signal generating circuit illustrated in FIG. 6 in accordance with an embodiment of the present disclosure.
Figure 11:
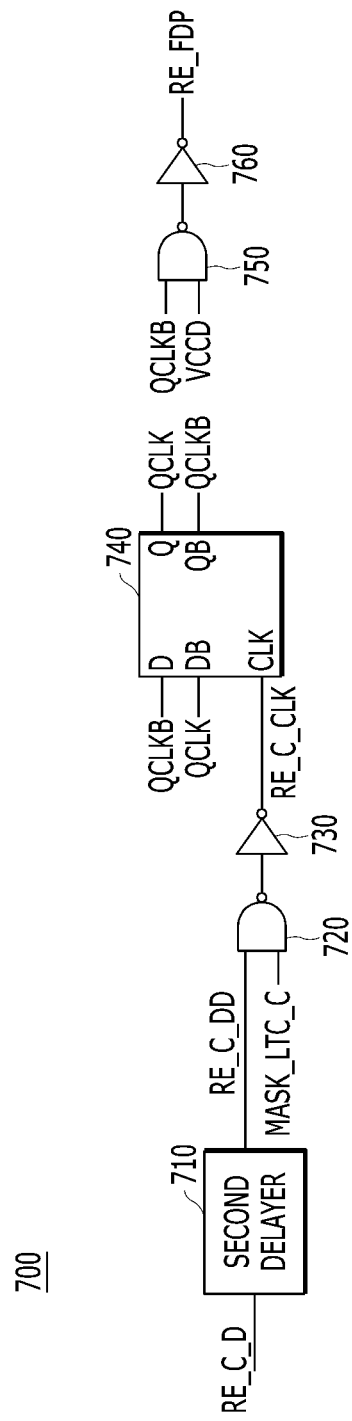
FIG. 11 is a diagram illustrating a configuration of a second control signal generating circuit illustrated in FIG. 6 in accordance with an embodiment of the present disclosure.
Figure 12A:
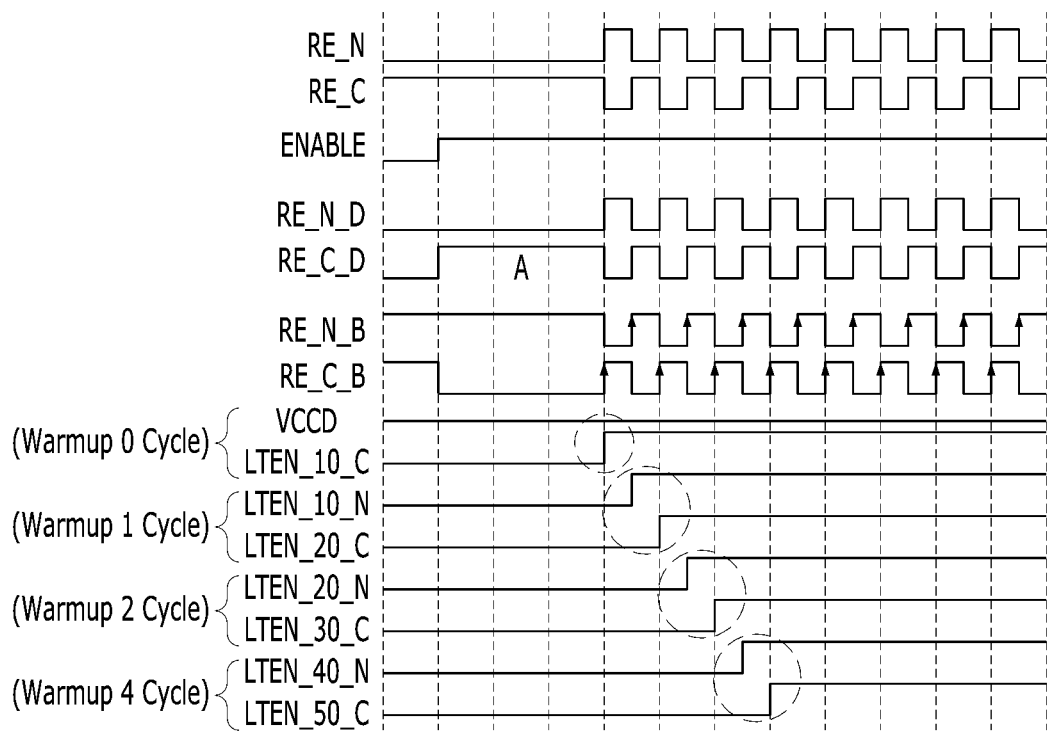
FIGS. 12A and 12B are operation timing diagrams of the data output control circuit in accordance with another embodiment of the present disclosure.

FIG. 6 is a diagram illustrating a configuration of a data output control circuit 132 in accordance with another embodiment of the present disclosure. FIG. 7 is a diagram illustrating a configuration of a first timing signal generating circuit illustrated in FIG. 6 in accordance with another embodiment of the present disclosure. FIG. 8 is a diagram illustrating a configuration of a first control signal generating circuit illustrated in FIG. 6 in accordance with another embodiment of the present disclosure. FIG. 9 is a diagram illustrating a configuration of an eleventh flipflop illustrated in FIG. 8 in accordance with another embodiment of the present disclosure. FIG. 10 is a diagram illustrating a configuration of a second timing signal generating circuit illustrated in FIG. 6 in accordance with another embodiment of the present disclosure. FIG. 11 is a diagram illustrating a configuration of a second control signal generating circuit illustrated in FIG. 6 in accordance with another embodiment of the present disclosure. FIGS. 12A and 12B are an operation timing diagram of the data output control circuit in accordance with another embodiment of the present disclosure.

According to another embodiment of the present disclosure, the data output control circuit 132 may include a decoder 310, a first data output control circuit 320 and a second data output control circuit 330 as illustrated in FIG. 6.

The decoder 310 may decode warming-up cycle preliminary information LTC<0:1>, which is for setting the warming-up cycle, to generate warming-up cycle information LTC00, LTC01, LTC10, and LTC11.

LTC00, LTC01, LTC10, and LTC11 may correspond to warming-up cycles, which are set as '0', '1', '2' and '4', respectively.

For example, if LTC00 among the warming-up cycle information LTC00, LTC01, LTC10, and LTC11 has a high level, it indicates that the warming-up cycle of the semiconductor device 100 is set as '0'. If LTC01 among the warming-up cycle information LTC00, LTC01, LTC10, and LTC11 has a high level, it indicates that the warming-up cycle of the semiconductor device 100 is set as '1'. If LTC10 among the warming-up cycle information LTC00, LTC01, LTC10, and LTC11 has a high level, it indicates that the warming-up cycle of the semiconductor device 100 is set as '2'. If LTC11 among the warming-up cycle information LTC00, LTC01, LTC10, and LTC11 has a high level, it indicates that the warming-up cycle of the semiconductor device 100 is set as '4'.

The first data output control circuit 320 may generate a first latch read enable signal RE_N_D and a first data output control timing signal MASK_LTC_N based on a first read enable signal RE_N, an internal enable signal ENABLE and the warming-up cycle information LTC00, LTC01, LTC10, and LTC11, and may generate a first data output control signal RE_RDP using a masking signal of pulses corresponding to the warming-up cycle information LTC00, LTC01, LTC10, and LTC11 among the pulses of the first latch read enable signal RE_N_D according to the first data output control timing signal MASK_LTC_N.

The second data output control circuit 330 may generate a second latch read enable signal RE_C_D and a second data output control timing signal MASK_LTC_C based on a second read enable signal RE_C, which is complementary with the first read enable signal RE_N, the internal enable signal ENABLE and the warming-up cycle information LTC00, LTC01, LTC10, and LTC11, and may generate a second data output control signal RE_FDP using a masking signal of pulses corresponding to the warming-up cycle information LTC00, LTC01, LTC10, and LTC11 among the pulses of the second latch read enable signal RE_C_D according to the second data output control timing signal MASK_LTC_C.

Herein, the internal enable signal ENABLE is a signal, which is enabled when the read command (not shown) is applied, and after the internal enable signal ENABLE is applied, a first read enable signal RE_N and a second read enable signal RE_C are inputted.

Referring to FIGS. 6 and 7, the first data output control circuit 320 may include a first timing signal generation circuit 400 and a first control signal generation circuit 600.

The first timing signal generation circuit 400 may generate the first latch read enable signal RE_N_D and a first inverted read enable signal RE_N_B according to the first read enable signal RE_N and the internal enable signal ENABLE, and may generate the first data output control timing signal MASK_LTC_N by selectively combining preliminary timing signals LTE10_N, LTE20_N, LTE40_N, LTE10_C, LTE20_C and LTE50_C according to the first inverted read enable signal RE_N_B and the warming-up cycle information LTC00, LTC01, LTC10 and LTC11.

The first timing signal generation circuit 400 may include a first logic gate group 410, a first shift register 420 and a first multiplexer 430.

The first logic gate group 410 may include a first NAND gate 411, a first inverter 412 and a second inverter 413.

The first NAND gate 411 may output a NAND logic operation result of the first read enable signal RE_N and the internal enable signal ENABLE.

The first inverter 412 may generate the first latch read enable signal RE_N_D by inverting the NAND logic operation result of the first NAND gate 411.

The second inverter 413 may generate the first inverted read enable signal RE_N_B by inverting the first latch read enable signal RE_N_D.

The first shift register 420 may generate first to fifth preliminary timing signals LTE10_N, LTE20_N, LTE30_N, LTE40_N and LTE50_N by shifting the power voltage VCCD according to the first inverted read enable signal RE_N_B.

The first shift register 420 may include first to fifth flipflops 421-425.

The first to fifth flipflops 421 to 425 may receive commonly the first inverted read enable signal RE_N_B as a clock signal CLK, which is a reference signal for the shifting operation.

The first flipflop 421 may latch a voltage level of the power voltage VCCD in response to the transition of the first inverted read enable signal RE_N_B and output the first preliminary timing signal LTEN10_N as a latched voltage level.

The second flipflop 422 may latch the first preliminary timing signal LTEN10_N in response to the transition of the first inverted read enable signal RE_N_B and output the second preliminary timing signal LTEN20_N as a latched first preliminary timing signal.

The third flipflop 423 may latch the second preliminary timing signal LTEN20_N in response to the transition of the first inverted read enable signal RE_N_B and output the third preliminary timing signal LTEN30_N as a latched second preliminary timing signal.

The fourth flipflop 424 may latch the third preliminary timing signal LTEN30_N in response to the transition of the first inverted read enable signal RE_N_B and output the fourth preliminary timing signal LTEN40_N as a latched third preliminary timing signal.

The fifth flipflop 425 may latch the fourth preliminary timing signal LTEN40_N in response to the transition of the first inverted read enable signal RE_N_B and output the fifth preliminary timing signal LTEN50_N as a latched fourth preliminary timing signal.

Referring to FIG. 12A, the first to fifth preliminary timing signals LTEN10_N, LTEN20_N, LTEN30_N, LTEN40_N and LTEN50_N sequentially transition to the high level according to a rising edge of the first inverted read enable signal RE_N_B.

The first multiplexer 430 may output the first data output control timing signal MASK_LTC_N as one of the preliminary signals LTE10_N, LTE20_N and LTE40_N and the power voltage VCCD according to the warming-up cycle information LTC00, LTC01, LTC10, LTC11.

Herein, the first multiplexer 430 shown in FIG. 7 is designed as an example of a case that the third preliminary timing signal LTEN30_N is not inputted.

Referring to FIGS. 7 and 12A, if LTC01 among the warming-up cycle information LTC00, LTC01, LTC10, and LTC11 has a high level, the first multiplexer 430 outputs the first data output control preliminary timing signal MASK_LTC_N as the first preliminary timing signal LTEN10_N. If LTC10 among the warming-up cycle information LTC00, LTC01, LTC10, and LTC11 has a high level, the first multiplexer 430 outputs the first data output control preliminary timing signal MASK_LTC_N as the second preliminary timing signal LTEN20_N. If LTC11 among the warming-up cycle information LTC00, LTC01, LTC10, and LTC11 has a high level, the first multiplexer 430 outputs the first data output control preliminary timing signal MASK_LTC_N as the fourth preliminary timing signal LTEN40_N.

Also, if LTC00 among the warming-up cycle information LTC00, LTC01, LTC10, and LTC11 has a high level, i.e., if the warming-up cycle is not applied, the first multiplexer 430 outputs the first data output control preliminary timing signal MASK_LTC_N as the power voltage VCCD having the high voltage level at a timing prior to the transition timing of the first preliminary timing signal LTEN10_N.

Referring to FIGS. 6 and 8, the first control signal generation circuit 600 may generate the first data output control signal RE_RDP using the masking signal of pulses corresponding to the warming-up cycle information LTC00, LTC01, LTC10, and LTC11 among the pulses of the first latch read enable signal RE_N_D according to the first data output control timing signal MASK_LTC_N.

The first control signal generation circuit 600 may include a first delayer 610, a second logic gate group, a first division circuit 640 and a third logic gate group.

The first delayer 610 may output a first latch compensation read enable signal RE_N_DD by delaying the first latch read enable signal RE_N_D by a predetermined time. The first delayer 610 may be configured to compensate for a signal process delay of the first timing signal generation circuit 400. That is, the first delayer 610 may be designed to delay a time as much as the signal process delay of the first timing signal generation circuit 400.

The second logic gate group may include a second NAND gate 620 and a third inverter 630.

The second NAND gate 620 may output a NAND logic operation result of the first latch compensation read enable signal RE_N_DD and the first data output control timing signal MASK_LTC_N.

The third inverter 630 may output a first clock signal RE_N_CLK by inverting the NAND logic operation result of the second NAND gate 620.

When the first read enable signal RE_N is not at the high level, i.e., the first latch compensation read enable signal RE_N_DD is not at the high level, the first clock signal RE_N_CLK is applied at a low level to the first division circuit 640. That is, a leakage current may be prevented by the first data output control timing signal MASK_LTC_N.

Figure 12B:
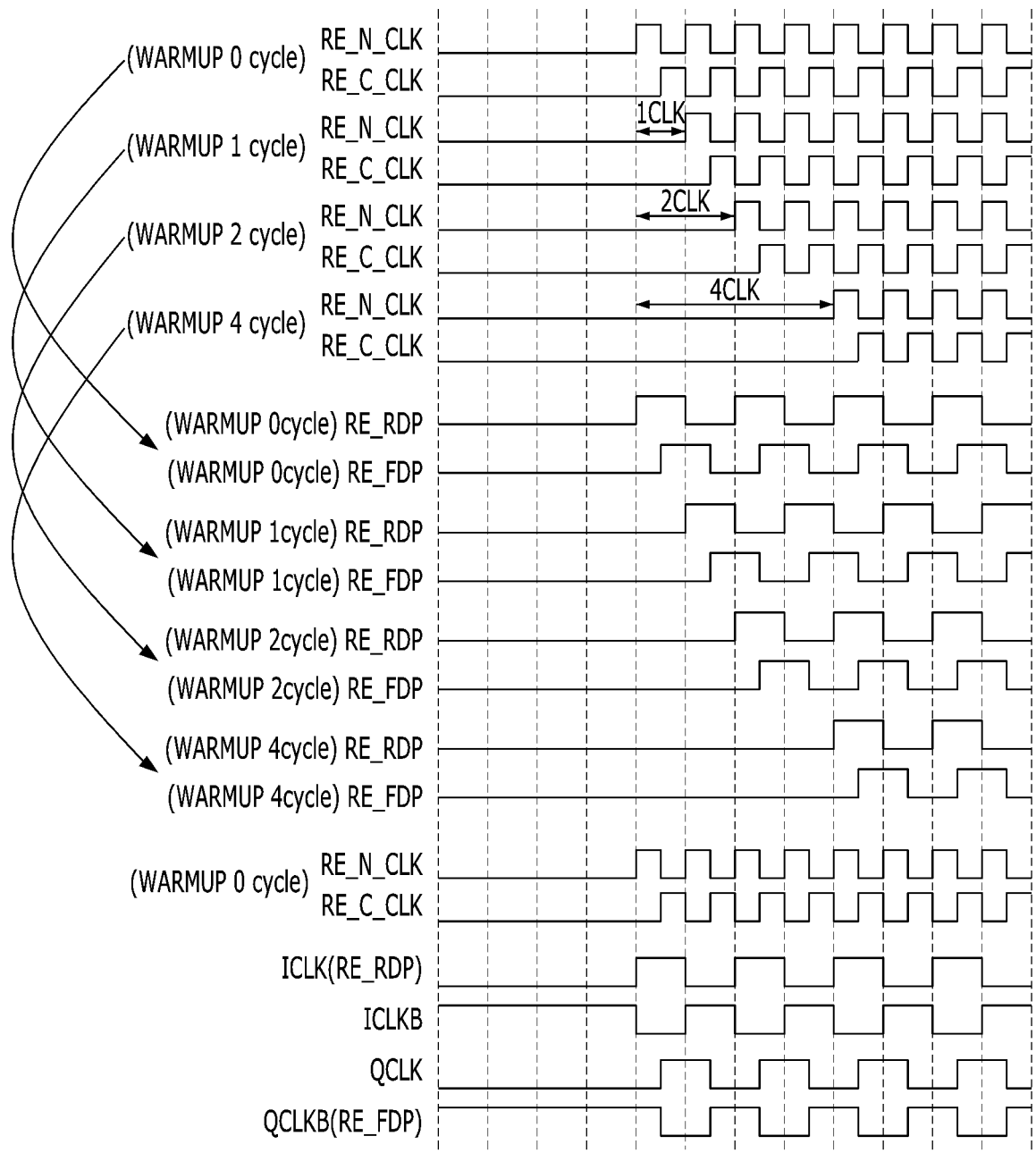

Referring to FIG. 12B, when the warming-up cycle is set as '0' (warming-up 0 cycle), the first clock signal RE_N_CLK has the same waveform as a waveform of the first read enable signal RE_N. When the warming-up cycle is set as '1' (warming-up 1 cycle), the first clock signal RE_N_CLK has a mask waveform of a first cycle of the first read enable signal RE_N. When the warming-up cycle is set as '2' (warming-up 2 cycle), the first clock signal RE_N_CLK has a mask waveform of the first cycle and the second cycle of the first read enable signal RE_N. When the warming-up cycle is set as '4' (warming-up 4 cycle), the first clock signal RE_N_CLK has the mask waveform of the first cycle to fourth cycle of the first read enable signal RE_N.

The first division circuit 640 may receive the third phase clock signal ICLKB as a non-inverted input signal and the first phase clock signal ICLK as an inverted input signal. The first division circuit 640 may output the first phase clock signal ICLK as the non-inverted output signal and the third phase clock signal ICLKB as the inverted output signal according to the first clock signal RE_N_CLK.

That is, the first division circuit 640 may receive and divide the first clock signal RE_N_CLK and generate a first phase clock signal ICLK and a third phase clock signal ICLKB among multiple phase clock signals ICLK, QCLK, ICLKB and QCLKB.

The multiple phase clock signals ICLK, QCLK, ICLKB and QCLKB may have a half frequency of the first read enable signal RE_N and the first clock signal RE_N_CLK.

The first division circuit 640 may include an eleventh flipflop. The eleventh flipflop may generate the first phase clock signal ICLK and the third phase clock signal ICLKB by latching the third clock signal ICLKB and the first phase clock signal ICLK in response to the transition of the first clock signal RE_N_CLK.

Referring to FIG. 9, the eleventh flipflop may be configured to have a cross-coupled structure. An NMOS transistor included in a tail region 642 of the eleventh flipflop may have a high voltage threshold transistor. The other transistors except the NMOS transistor of the tail region 642 may have low voltage threshold transistor. Herein, since the first clock signal RE_N_CLK maintains a low voltage level except a toggling time, the NMOS transistor of the tail region 642 is switched off and the leakage current is prevented. Since the flipflop having the cross-couped structure is commonly known to a person skilled in the art, the detailed descriptions of the flipflop having the cross-couped structure will be omitted.

The third logic gate group may include the third NAND gate 650 and the fourth inverter 660.

The third NAND gate 650 may output a NAND logic operation result of the power supply voltage VDD according to the first phase clock signal ICLK.

The fourth inverter 660 may generate and output the first data output control signal RE_RDP by inverting the NAND logic operation result of the third NAND gate 650.

Referring to FIG. 12B, the first data output control signal RE_RDP may start to transit on a basis of a rising edge of the first clock signal RE_N_CLK according to the warming-up 0 cycle, the warming-up 1 cycle, the warming-up 2 cycle and the warming-up 4 cycle. The first data output control signal RE_RDP may have a half frequency of the first clock signal RE_N_CLK.

Referring to FIGS. 6 and 10, the second data output control circuit 330 may include a second timing signal generation circuit 500 and a second control signal generation circuit 700.

The second timing signal generation circuit 500 may generate a second latch read enable signal RE_C_D and a second inverted read enable signal RE_C_B according to the second read enable signal RE_C and the internal enable signal ENABLE, and may generate a second data output control timing signal MASK_LTC_C by selectively combining preliminary timing signals LTE10_N, LTE20_N, LTE40_N, LTE10_C, LTE20_C and LTE50_C according to the second inverted read enable signal RE_C_B and the warming-up cycle information LTC00, LTC01, LTC10 and LTC11.

The second read enable signal RE_C may have an opposite phase to the first read enable signal RE_N, and have the same phase as the first inverted read enable signal RE_N_C. The second inverted read enable signal RE_C_B may have the same phase as the first read enable signal RE_N.

The second timing signal generation circuit 500 may include a fourth logic gate group 510, a second shift register 520 and a second multiplexer 530.

The fourth logic gate group 510 may include a fourth NAND gate 511, a fifth inverter 512 and a sixth inverter 513.

The fourth NAND gate 511 may output a NAND logic operation result of the second read enable signal RE_C and the internal enable signal ENABLE.

The fifth inverter 512 may generate the second latch read enable signal RE_C_D by inverting the NAND logic operation result of the fourth NAND gate 511. Herein, the second latch read enable signal RE_C_D maintains a high level before an external clock signal is toggled as 'A' region shown in FIG. 12A.

The sixth inverter 513 may generate the second inverted read enable signal RE_C_B by inverting the second latch read enable signal RE_C_D.

The second shift register 520 may generate sixth to tenth preliminary timing signals LTE10_C, LTE20_C, LTE30_C, LTE40_C and LTE50_C by shifting the power voltage VCCD according to the second inverted read enable signal RE_C_B.

The second shift register 520 may include sixth to eleventh flipflops 521 to 525.

The sixth to eleventh flipflops 521 to 525 may receive commonly the second inverted read enable signal RE_C_B as the clock signal CLK, which is a reference signal for the shifting operation.

The sixth flipflop 521 may latch a voltage level of the power voltage VCCD in response to the transition of the second inverted read enable signal RE_C_B and output the sixth preliminary timing signal LTEN10_C as a latched voltage signal.

The seventh flipflop 522 may latch the sixth preliminary timing signal LTEN10_C in response to the transition of the second inverted read enable signal RE_C_B and output the seventh preliminary timing signal LTEN20_C as a latched sixth preliminary timing signal.

The eighth flipflop 523 may latch the seventh preliminary timing signal LTEN20_C in response to the transition of the second inverted read enable signal RE_C_B and output the eighth preliminary timing signal LTEN30_C as a latched seventh preliminary timing signal.

The ninth flipflop 524 may latch the eighth preliminary timing signal LTEN30_C in response to the transition of the second inverted read enable signal RE_C_B and output the ninth preliminary timing signal LTEN40_C as a latched eighth preliminary timing signal.

The tenth flipflop 525 may latch the ninth preliminary timing signal LTEN40_C in response to the transition of the second inverted read enable signal RE_C_B and output the tenth preliminary timing signal LTEN50_C as a latched ninth preliminary timing signal.

Referring to FIG. 12A, the sixth to tenth preliminary timing signals LTEN10_C, LTE20_C, LTE30_C, LTE40_C and LTE50_C sequentially transition to the high level according to a rising edge of the second inverted read enable signal RE_C_B.

The second multiplexer 530 may output the second data output control timing signal MASK_LTC_N as one of the preliminary signals LTE10_C, LTE20_C and LTE30_C and LTE50_C according to the warming-up cycle information LTC00, LTC01, LTC10, LTC11.

Herein, the second multiplexer 530 shown in FIG. 10 is designed as an example of a case that the ninth preliminary timing signal LTEN40_C is not inputted.

Referring to FIGS. 10 and 12A, if LTC01 among the warming-up cycle information LTC00, LTC01, LTC10, and LTC11 has a high level, the second multiplexer 530 outputs the second data output control preliminary timing signal MASK_LTC_C as the seventh preliminary timing signal LTEN20_C. If LTC10 among the warming-up cycle information LTC00, LTC01, LTC10, and LTC11 has a high level, the second multiplexer 530 outputs the second data output control preliminary timing signal MASK_LTC_C as the eighth preliminary timing signal LTEN30_C. If LTC11 among the warming-up cycle information LTC00, LTC01, LTC10, and LTC11 has a high level, the second multiplexer 530 outputs the second data output control preliminary timing signal MASK_LTC_C as the tenth preliminary timing signal LTEN50_C.

Also, if LTC00 among the warming-up cycle information LTC00, LTC01, LTC10, and LTC11 has a high level, i.e., if the warming-up cycle is not applied, the second multiplexer 530 outputs the second data output control preliminary timing signal MASK_LTC_C as the sixth preliminary timing signal LTEN10_C at a prior timing to the transition timing of the seventh preliminary timing signal LTEN20_C.

Referring to FIGS. 6 and 11, the second control signal generation circuit 700 may generate the second data output control signal RE_FDP using the masking signal of pulses corresponding to the warming-up cycle information LTC00, LTC01, LTC10, and LTC11 among the pulses of the second latch read enable signal RE_C_D according to the second data output control timing signal MASK_LTC_C.

The second control signal generation circuit 700 may include second delayer 710, a fifth logic gate group 720 and 730, a second division circuit 740 and a sixth logic gate group 750 and 760.

The second delayer 710 may output a second latch compensation read enable signal RE_C_DD by delaying the second latch read enable signal RE_C_D by a predetermined time. The second delayer 710 may be configured to compensate for a signal process delay of the second timing signal generation circuit 500. That is, the second delayer 710 may be designed to delay a time as much as the signal process delay of the second timing signal generation circuit 500.

The fifth logic gate group 720 and 730 may include a fifth NAND gate 720 and a seventh inverter 730.

The fifth NAND gate 720 may output a NAND logic operation result of the second latch compensation read enable signal RE_C_DD and the second data output control timing signal MASK_LTC_C.

The seventh inverter 730 may output a second clock signal RE_C_CLK by inverting the NAND logic operation result of the fifth NAND gate 720.

When the second read enable signal RE_C is not at the high level, i.e., the second latch compensation read enable signal RE_C_DD is not at the high level, the second clock signal RE_C_CLK is applied at a low level to the second division circuit 740. That is, a leakage current may be prevented by the second data output control timing signal MASK_LTC_C.

Referring to FIG. 12B, when the warming-up cycle is set as '0' (warming-up 0 cycle), the second clock signal RE_C_CLK has the same waveform as a waveform of the second read enable signal RE_C. When the warming-up cycle is set as '1' (warming-up 1 cycle), the second clock signal RE_C_CLK has a mask waveform of a first cycle of the second read enable signal RE_C. When the warming-up cycle is set as '2' (warming-up 2 cycle), the second clock signal RE_C-_CLK has a mask waveform of the first cycle and the second cycle of the second read enable signal RE_C. When the warming-up cycle is set as '4' (warming-up 4 cycle), the second clock signal RE_C_CLK has the mask waveform of the first cycle to fourth cycle of the second read enable signal RE_C.

The second division circuit 740 may receive the fourth phase clock signal QCLKB as a non-inverted input signal and the second phase clock signal QCLK as an inverted input signal. The second division circuit 740 may output the second phase clock signal QCLK as the non-inverted output signal and the fourth phase clock signal QCLKB as the inverted output signal according to the second clock signal RE_C_CLK.

That is, the second division circuit 740 may receive and divide the second clock signal RE_C_CLK and generate the second phase clock signal QCLK and the fourth phase clock signal QCLKB among multiple phase clock signals ICLK, QCLK, ICLKB and QCLKB.

The multiple phase clock signals ICLK, QCLK, ICLKB and QCLKB may have a half frequency of the second read enable signal RE_C and the second clock signal RE_C_CLK.

The second division circuit 740 may include a twelfth flipflop. Since the twelfth flipflop has same configuration of the eleventh flipflop of the first division circuit 640, the detailed descriptions of the twelfth flipflop will be omitted.

The sixth logic gate group 750 and 760 may include the sixth NAND gate 750 and the eighth inverter 760.

The sixth NAND gate 750 may output a NAND logic operation result of the power supply voltage VCCD according to the fourth phase clock signal QCLKB.

The eighth inverter 760 may generate and output the second data output control signal RE_FDP by inverting the NAND logic operation result of the sixth NAND gate 750.

Referring to FIG. 12B, the second data output control signal RE_FDP may start to transition on a basis of a rising edge of the second clock signal RE_C_CLK according to the warming-up 0 cycle, the warming-up 1 cycle, the warming-up 2 cycle and the warming-up 4 cycle. The second data output control signal RE_FDP may have a half frequency of the second clock signal RE_C_CLK.

Thus, the semiconductor device 100 may stably generate the first data output control signal RE_RDP and the second data output control signal RE_FDP irrespective of an operation condition of the semiconductor device 100, i.e., a low voltage and high frequency operation condition.

Although various embodiments have been described for illustrative purposes, it will be apparent to those skilled in the art that various changes and modifications may be made without departing from the spirit and scope of the disclosure as defined in the following claims. Furthermore, the embodiments may be combined to form additional embodiments.

What is claimed is:

1. A data output control circuit comprising:
a decoder suitable for generating warming-up cycle information indicating different warming-up cycles by decoding warming-up cycle preliminary information for setting one of the warming-up cycles;
a first data output control circuit suitable for generating a first latch read enable signal and a first data output control timing signal based on a first read enable signal, an internal enable signal and the warming-up cycle information, and generating, in response to the first data output control timing signal, a first data output control signal using the first latch read enable signal, one or more pulses of which are masked according to the warming-up cycle information; and
a second data output control circuit suitable for generating a second latch read enable signal and a second data output control timing signal based on a second read enable signal, which is complementary to the first read enable signal, the internal enable signal and the warming-up cycle information, and generating, in response to the second data output control timing signal, a second data output control signal using the second latch read enable signal, one or more pulses of which are masked according to the warming-up cycle information.

2. The data output control circuit of claim 1, wherein the first data output control circuit includes:
a first timing signal generation circuit suitable for generating the first latch read enable signal and a first inverted read enable signal according to the first read enable signal and the internal enable signal, and generating the first data output control timing signal by selectively combining preliminary timing signals according to the warming-up cycle information and the first inverted read enable signal; and
a first control signal generation circuit suitable for generating the first data output control signal using the masked first latch read enable signal.

3. The data output control circuit of claim 2, wherein the first timing signal generation circuit includes:
a first logic gate group suitable for generating the first latch read enable signal by inverting a NAND logic operation result signal of the first read enable signal and the internal enable signal, and generating a first inverted read enable signal by inverting the first latch read enable signal;
a first shift register suitable for generating first to fifth preliminary timing signals by shifting a power voltage according to the first inverted read enable signal; and
a first multiplexer suitable for outputting the first data output control timing signal as one of the first to fifth preliminary timing signals and the power voltage according to the warming-up cycle information.

4. The data output control circuit of claim 3, wherein the first logic gate group includes:
a first NAND gate suitable for outputting the NAND logic operation result signal according to the internal enable signal and the first read enable signal;
a first inverter suitable for generating the first latch read enable signal by inverting the NAND logic operation result signal; and
a second inverter suitable for generating the first inverted read enable signal by inverting the first latch read enable signal.

5. The data output control circuit of claim 3, wherein the first shift register includes:
a first flipflop suitable for outputting the first preliminary timing signal by latching a voltage level of the power voltage in response to the transition of the first inverted read enable signal;
a second flipflop suitable for outputting the second preliminary timing signal by latching the first preliminary timing signal in response to the transition of the first inverted read enable signal;
a third flipflop suitable for outputting the third preliminary timing signal by latching the second preliminary timing signal in response to the transition of the first inverted read enable signal;
a fourth flipflop suitable for outputting the fourth preliminary timing signal by latching the third preliminary timing signal in response to the transition of the first inverted read enable signal; and
a fifth flipflop suitable for outputting the fifth preliminary timing signal by latching the fourth preliminary timing signal in response to the transition of the first inverted read enable signal.

6. The data output control circuit of claim 2, wherein the first control signal generation circuit includes:
a first delayer suitable for generating a first latch compensation read enable signal by delaying the first latch read enable signal by a predetermined time;
a second logic gate group suitable for generating a first clock signal by inverting a NAND logic operation result signal of the first latch compensation read enable signal and the first data output control timing signal;
a first division circuit suitable for generating multiple phase clock signals by dividing a phase of the first clock signal, and generating a first phase clock signal and a third phase clock signal of the multiple phase clock signals; and
a third logic gate group suitable for outputting the first data output control signal by inverting a NAND logic operation result signal of a power voltage output according to the first phase clock signal.

7. The data output control circuit of claim 6, wherein the first division circuit includes an eleventh flipflop having a cross-couple structure and suitable for preventing a leakage current.

8. The data output control circuit of claim 6, wherein the first data output control signal starts to transition on a basis of a rising edge of the first clock signal according to the warming-up cycle.

9. The data output control circuit of claim 1, wherein the second data output control circuit includes:
a second timing signal generation circuit suitable for generating the second latch read enable signal and a second inverted read enable signal according to the second read enable signal and the internal enable signal, and generating the second data output control timing signal by selectively combining preliminary timing signals according to the warming-up cycle information and the second inverted read enable signal; and a second control signal generation circuit suitable for generating the second data output control signal using the masked second latch read enable signal.

10. The data output control circuit of claim 9, wherein the second timing signal generation circuit includes:

a fourth logic gate group suitable for generating the second latch read enable signal by inverting a NAND logic operation result signal of the second read enable signal and the internal enable signal, and generating a second inverted read enable signal by inverting the second latch read enable signal;

a second shift register suitable for generating sixth to tenth preliminary timing signals by shifting a power voltage according to the second inverted read enable signal; and a second multiplexer suitable for outputting the second data output control timing signal as one of the sixth to tenth preliminary timing signals and the power voltage according to the warming-up cycle information.

11. The data output control circuit of claim 10, wherein the fourth logic gate group includes:

a fourth NAND gate suitable for outputting the NAND logic operation result signal according to the internal enable signal and the second read enable signal;

a fifth inverter suitable for generating the second latch read enable signal by inverting the NAND logic operation result signal; and a sixth inverter suitable for generating the second inverted read enable signal by inverting the second latch read enable signal.

12. The data output control circuit of claim 10, wherein the second shift register includes:

a sixth flipflop suitable for outputting the sixth preliminary timing signal by latching a voltage level of the power voltage in response to the transition of the second inverted read enable signal;

a seventh flipflop suitable for outputting the seventh preliminary timing signal by latching the sixth preliminary timing signal in response to the transition of the second inverted read enable signal;

an eighth flipflop suitable for outputting the eighth preliminary timing signal by latching the seventh preliminary timing signal in response to the transition of the second inverted read enable signal;

a ninth flipflop suitable for outputting the ninth preliminary timing signal by latching the eighth preliminary timing signal in response to the transition of the second inverted read enable signal; and a tenth flipflop suitable for outputting the tenth preliminary timing signal by latching the ninth preliminary timing signal in response to the transition of the second inverted read enable signal.

13. The data output control circuit of claim 9, wherein the second control signal generation circuit includes:

a second delayer suitable for generating a second latch compensation read enable signal by delaying the second latch read enable signal by a predetermined time;

a fifth logic gate group suitable for generating a second clock signal by inverting a NAND logic operation result signal of the second latch compensation read enable signal and the second data output control timing signal;

a second division circuit suitable for generating a multiple phase clock signal by dividing a phase of the second clock signal and generating a second phase clock signal and a fourth phase clock signal of the multiple phase clock signal; and a sixth logic gate group suitable for outputting the second data output control signal by inverting a NAND logic operation result signal of a power voltage output according to the fourth phase clock signal.

14. The data output control circuit of claim 13, wherein the second data output control signal starts to transition on a basis of a rising edge of the second clock signal according to the warming-up cycle and has a half frequency of the second clock signal.

15. A semiconductor device comprising:

a memory cell array including a plurality of memory cells;

a data input/output circuit suitable for outputting data provided from the memory cell array in response to a couple of data output control signals; and a data output control circuit suitable for generating a couple of latch read enable signals and a couple of data output control timing signals based on a couple of complementary read enable signals, an internal enable signal and warming-up cycle information indicating different warming-up cycles, and outputting, according to the couple of data output control timing signals, the couple of data output control signals using the couple of latch read enable signals, one or more pulses of each of which are masked according to the warming-up cycle information.

16. The semiconductor device of claim 15, wherein the data output control circuit includes:

a decoder suitable for generating the warming-up cycle information by decoding warming-up cycle preliminary information for setting one of the warming-up cycles;

a first data output control circuit suitable for generating a first one of the couple of latch read enable signals and a first one of the couple of data output control timing signals based on a first one of the complementary read enable signals, the internal enable signal and the warming-up cycle information, and generating, in response to the first data output control timing signal, a first one of the couple of data output control signals using the first latch read enable signal, one or more pulses of which are masked according to the warming-up cycle information; and a second data output control circuit suitable for generating a second one of the couple of latch read enable signals and a second one of the couple of data output control timing signals based on a second one of the complementary read enable signals, the internal enable signal and the warming-up cycle information, and generating, in response to the second data output control timing signal, a second one of the couple of data output control signals using the second latch read enable signal, one or more pulses of which are masked according to the warming-up cycle information.

17. The semiconductor device of claim 16, wherein the first data output control circuit includes:

a first timing signal generation circuit suitable for generating the first latch read enable signal and a first inverted read enable signal according to the first read enable signal and the internal enable signal, and generating the first data output control timing signal by selectively combining preliminary timing signals according to the warming-up cycle information and the first inverted read enable signal; and a first control signal generation circuit suitable for generating the first data output control signal using the masked first latch read enable signal.

18. The semiconductor device of claim 17, wherein the first timing signal generation circuit includes:

a first logic gate group suitable for generating the first latch enable signal by inverting a NAND logic operation result signal of the first read enable signal and the internal enable signal, and generating a first inverted read enable signal by inverting the first latch enable signal;

a first shift register suitable for generating first to fifth preliminary timing signals by shifting a power voltage according to the first inverted read enable signal; and a first multiplexer suitable for outputting the first data output control timing signal as one of the first to fifth preliminary timing signals and the power voltage according to the warming-up cycle information.

19. The semiconductor device of claim 17, wherein the first control signal generation circuit includes:

a first delayer suitable for generating a first latch compensation read enable signal by delaying the first latch read enable signal by a predetermined time;

a second logic gate group suitable for generating a first clock signal by inverting a NAND logic operation result signal of the first latch compensation read enable signal and the first data output control timing signal;

a first division circuit suitable for generating multiple phase clock signals by dividing a phase of the first clock signal and generating a first phase clock signal and a third phase clock signal of the multiple phase clock signals; and a third logic gate group suitable for outputting the first data output control signal by inverting a NAND logic operation result signal of a power voltage output according to the first phase clock signal.

20. The semiconductor device of claim 16, wherein the second data output control circuit includes:

a second timing signal generation circuit suitable for generating the second latch read enable signal and a second inverted read enable signal according to the second read enable signal and the internal enable signal, and generating the second data output control timing signal by selectively combining preliminary timing signals according to the warming-up cycle information and the second inverted read enable signal; and a second control signal generation circuit suitable for generating the second data output control signal using the masked second latch read enable signal.

21. A semiconductor device comprising:

first and second circuits each configured to:

enable a timing signal according to an edge of a corresponding one of first and second input clocks, the edge corresponding to an enabled one of information signals representing respective warming-up cycles, the first and second input clocks being complementary to each other, generate an internal clock by masking one or more cycles of the input clock according to the enabled timing signal, and generate a corresponding one of first and second output clocks according to an edge of the internal clock, the first and second output clocks having a half frequency of the input clocks and having different phases from each other.

* * * * *